US012648439B2

(12) United States Patent
Nagasawa

(10) Patent No.: US 12,648,439 B2
(45) Date of Patent: Jun. 2, 2026

(54) HEAT CONDUCTOR AND THERMAL MANAGEMENT PART

(71) Applicant: SHINKO ELECTRIC INDUSTRIES CO., LTD., Nagano (JP)

(72) Inventor: Takamasa Nagasawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 379 days.

(21) Appl. No.: 18/494,281

(22) Filed: Oct. 25, 2023

(65) Prior Publication Data

US 2024/0145335 A1 May 2, 2024

(30) Foreign Application Priority Data

Nov. 1, 2022 (JP) ................................. 2022-175382

(51) Int. Cl.
*H10W 40/25* (2026.01)
*H10W 90/00* (2026.01)

(52) U.S. Cl.
CPC ......... *H10W 40/25* (2026.01); *H10W 40/251* (2026.01); *H10W 40/259* (2026.01); *H10W 90/734* (2026.01)

(58) Field of Classification Search
CPC ............ H10K 85/221; H01L 21/02606; H01L 23/373; H01L 23/3731; H01L 23/3737; H01L 24/32; H01L 2224/32225
See application file for complete search history.

(56) References Cited

U.S. PATENT DOCUMENTS

| | | | |
|---|---|---|---|
| 7,168,484 B2 * | 1/2007 | Zhang | F28F 3/02 257/E23.09 |
| 9,017,808 B2 * | 4/2015 | Wang | H01L 23/373 428/323 |
| 2006/0071334 A1 | 4/2006 | Kawabata et al. | |
| 2006/0234056 A1 * | 10/2006 | Huang | H01L 23/373 428/408 |
| 2009/0271982 A1 * | 11/2009 | Lee | H01L 21/76879 977/932 |
| 2011/0090650 A1 | 4/2011 | Oda | |
| 2017/0069595 A1 * | 3/2017 | Haba | H01L 24/83 |
| 2020/0357718 A1 | 11/2020 | Hirose et al. | |

FOREIGN PATENT DOCUMENTS

| | | |
|---|---|---|
| JP | 2006-108377 | 4/2006 |
| JP | 2011-091106 | 5/2011 |
| JP | 2020-184576 | 11/2020 |

* cited by examiner

*Primary Examiner* — Jayprakash N Gandhi
*Assistant Examiner* — Matthew Sinclair Muir
(74) *Attorney, Agent, or Firm* — IPUSA, PLLC

(57) ABSTRACT

A heat conductor includes a base including a forest of carbon nanotubes, a first solder layer on a first surface of the base, and a second solder layer on a second surface of the base opposite from the first surface. The second solder layer is electrically connected to the first solder layer via the carbon nanotubes.

15 Claims, 12 Drawing Sheets

HEAT CONDUCTOR AND THERMAL MANAGEMENT PART

CROSS-REFERENCE TO RELATED APPLICATION

This application is based upon and claims priority to Japanese Patent Application No. 2022-175382, filed on Nov. 1, 2022, the entire contents of which are incorporated herein by reference.

FIELD

A certain aspect of the embodiments discussed herein is related to heat conductors and thermal management parts.

BACKGROUND

Heat conductors including carbon nanotubes for better heat dissipation have been proposed (see Japanese Laid-open Patent Publication Nos. 2020-184576, 2006-108377, and 2011-091106).

SUMMARY

According to an aspect of the present disclosure, a heat conductor includes a base including a forest of carbon nanotubes, a first solder layer on a first surface of the base, and a second solder layer on a second surface of the base opposite from the first surface. The second solder layer is electrically connected to the first solder layer via the carbon nanotubes.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
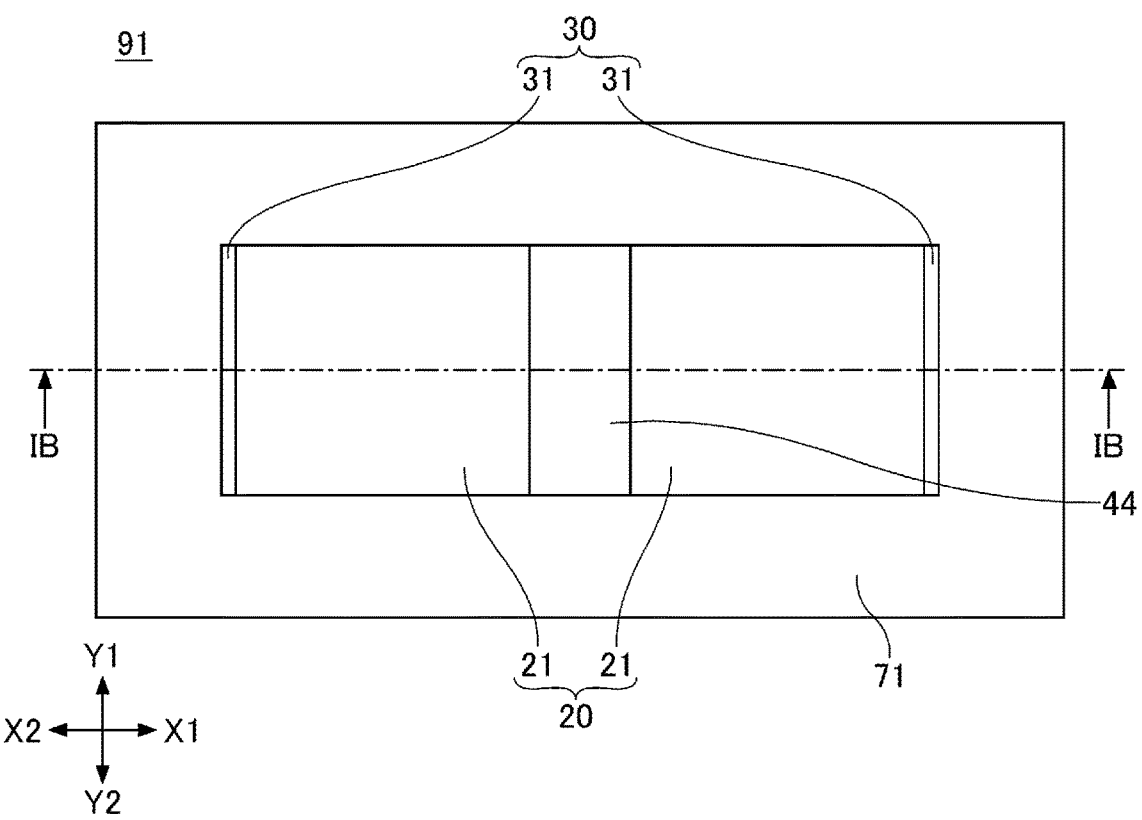
FIGS. 1A and 1B are diagrams illustrating a thermal management part according to a first embodiment.

The heat conductors as have been proposed cannot ensure electrical conduction between two components between which carbon nanotubes are sandwiched.

According to an aspect of the present disclosure, a heat conductor and a thermal management part that can ensure electrical conduction are provided.

Embodiments of the present disclosure are described in detail below with reference to the accompanying drawings. In the following description and the drawings, the same constituent elements having substantially the same functional configuration may be referred to using the same reference numeral, and a duplication description thereof may be omitted. Furthermore, according to the present disclosure, a Cartesian coordinate system for a three-dimensional space consisting of an X-axis line, a Y-axis line, and a Z-axis line that are orthogonal to one another is employed to describe the position and the configuration of an object such as a constituent element, with the origin being at the center of the constituent element. X1 and X2 represent opposite directions along the X-axis line, which directions may be collectively referred to as "X1-X2 direction." Y1 and Y2 represent opposite directions along the Y-axis line, which directions may be collectively referred to as "Y1-Y2 direction." Z1 and Z2 represent opposite directions along the Z-axis line, which directions may be collectively referred to as "Z1-Z2 direction." A plane including the X1-X2 direction and the Y1-Y2 direction is referred to as "XY plane." A plane including the Y1-Y2 direction and the Z1-Z2 direction is referred to as "YZ plane." A plane including the Z1-Z2 direction and the X1-X2 direction is referred to as "ZX plane." For convenience, the Z1-Z2 direction is defined as vertical directions with the Z1 side being an upper side and the Z2 side being a lower side. Furthermore, a plan view refers to a view of an object from the Z1 side, and a planar shape refers to the shape of an object as viewed from the Z1 side. A heat conductor and a thermal management part, however, may be used in an inverted position and may be oriented at any angle.

[a] First Embodiment

A first embodiment is described. The first embodiment relates to a thermal management part (a heat dissipation part or component).

Figure 1B:
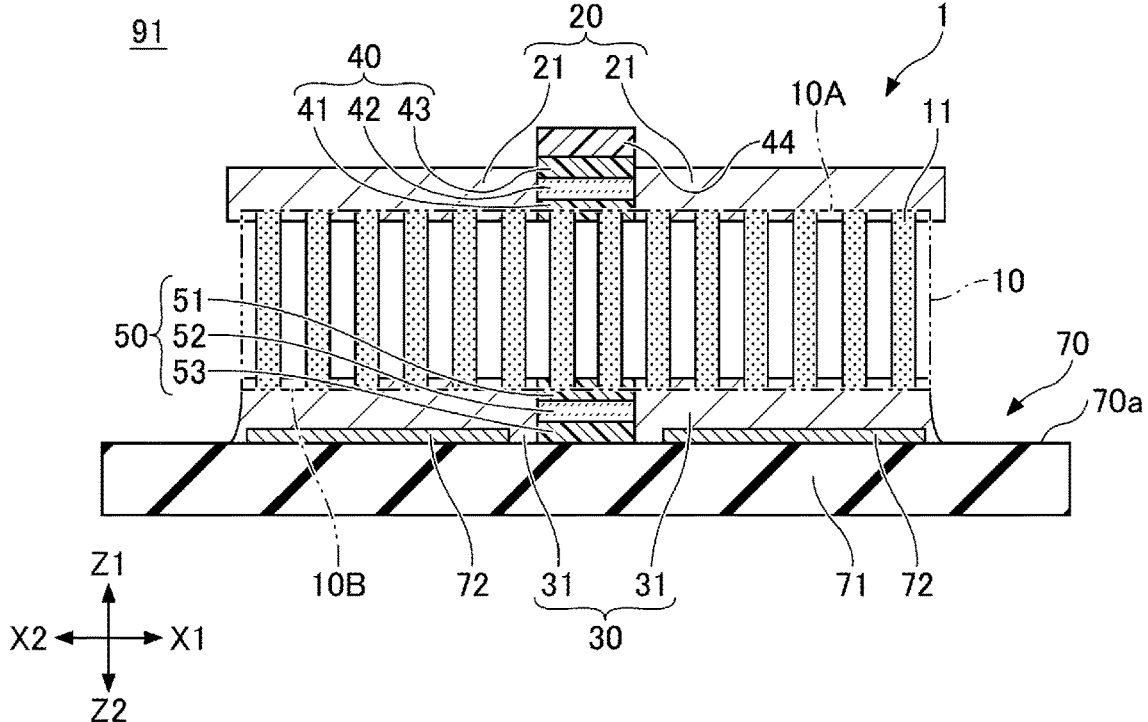

A structure of a thermal management part according to the first embodiment is described. FIGS. 1A and 1B are a plan view and a sectional view, respectively, of a thermal management part according to the first embodiment. FIG. 1B illustrates a section taken along the line IB-IB of FIG. 1A.

Referring to FIGS. 1A and 1B, a thermal management part 91 according to the first embodiment includes a substrate 70 and a heat conductor 1.

The substrate 70 includes a body 71 and multiple (two in the illustrated example) electrodes 72. The electrodes 72 are provided on one surface of the body 71 (a surface 70a of the substrate 70). The substrate 70 is, for example, a direct bonded copper (DBC) substrate. The DBC substrate may also be referred to as "direct copper bonding (DCB) substrate." The substrate 70 may also be a printed wiring board, a busbar, or the like.

The heat conductor 1 includes a base 10, a solder layer 20, a solder layer 30, an insulating member 40, an insulating member 50, and a protective layer 44.

The base 10 includes a forest of carbon nanotubes 11. For example, the cluster of the carbon nanotubes 11 constitutes the base 10. The carbon nanotubes 11 are carbon crystals, each having a substantially cylindrical shape (linear shape) of approximately 0.7 nm to 70 nm in diameter. The carbon nanotubes 11 have a thermal conductivity of, for example, approximately 3000 W/mK. The carbon nanotubes 11 are linear material of high thermal conductivity. The thickness of the base 10 is, for example, 50 μm to 200 μm. The base 10 has a surface 10A (a first surface) and a surface 10B (a second surface) that is on the opposite side from the surface 10A. The surface 10B faces toward the surface 70a of the substrate 70 on which surface the electrodes 72 are provided. The carbon nanotubes 11 are elongated between the surfaces 10A and 10B. That is, the carbon nanotubes 11 have respective first ends and second ends, the first ends defining the surface 10A and the second ends, defining the surface 10B.

The insulating member 40 is provided on the surface 10A of the base 10. For example, the insulating member 40 is elongated in the Y1-Y2 direction and is placed at the center of the surface 10A in the X1-X2 direction. The insulating member 40 includes a thermosetting resin layer 41, a ceramic layer 42, and a thermosetting resin layer 43. The thermosetting resin layer 41 is provided on the surface 10A of the base 10. The ceramic layer 42 is provided on the thermosetting resin layer 41. The thermosetting resin layer 43 is provided on the ceramic layer 42. The thermosetting resin layer 41 is interposed between the base 10 and the ceramic layer 42. The ceramic layer 42 is interposed between the thermosetting resin layers 41 and 43. The thermosetting resin layer 41 contacts the base 10. The ceramic layer 42 contacts the thermosetting resin layer 41. The thermosetting resin layer 43 contacts the ceramic layer 42. The thermosetting resin layers 41 and 43 include, for example, epoxy, polyimide, polyphenylether, or any combination thereof. The ceramic layer 42 includes, for example, aluminum nitride, alumina, silicon nitride, or any combination thereof. The thermosetting resin layers 41 and 43 are uncured. Being uncured includes being semi-cured. The thermosetting resin layer 41 is an example of a first thermosetting resin layer. The ceramic layer 42 is an example of a first ceramic layer. The thermosetting resin layer 43 is an example of a third thermosetting resin layer. The insulating member 40 is an example of a first insulating member.

The protective layer 44 is provided on the thermosetting resin layer 43. The protective layer 44 covers the thermosetting resin layer 43. The protective layer 44 protects the thermosetting resin layer 43 from contamination and damage. The protective layer 44 includes, for example, polyethylene terephthalate (PET). The protective layer 44 is an example of a first protective layer.

The solder layer 20 is provided on the surface 10A of the base 10. The solder layer 20 includes multiple (two in the illustrated example) regions 21. The regions 21 are separated and insulated from each other by the insulating member 40. The melting point of the solder layer 20 is, for example, 232° C. The solder layer 20 includes, for example, tin (Sn), silver (Ag), copper (Cu), and chromium (Cr). The solder layer 20 is composed of, for example, C-Solder (trademark) manufactured by Goodfellow. The solder layer 20 is an example of a first solder layer. The regions 21 are an example of a first region.

The insulating member 50 is provided on the surface 10B of the base 10. For example, the insulating member 50 is elongated in the Y1-Y2 direction and is placed at the center of the surface 10B in the X1-X2 direction. For example, the insulating members 40 and 50 are positioned one over the other in a plan view. The insulating member 50 includes a thermosetting resin layer 51, a ceramic layer 52, and a thermosetting resin layer 53. The thermosetting resin layer 51 is provided on the surface 10B of the base 10. The ceramic layer 52 is provided on (under) the thermosetting resin layer 51. The thermosetting resin layer 53 is provided on (under) the ceramic layer 52. The thermosetting resin layer 51 is interposed between the base 10 and the ceramic layer 52. The ceramic layer 52 is interposed between the thermosetting resin layers 51 and 53. The thermosetting resin layer 51 contacts the base 10. The ceramic layer 52 contacts the thermosetting resin layer 51. The thermosetting resin layer 53 contacts the ceramic layer 52. For example, the material of the thermosetting resin layers 51 and 53 is the same as the material of the thermosetting resin layers 41 and 43, and the material of the ceramic layer 52 is the same as the material of the ceramic layer 42. The thermosetting resin layers 51 and 53 are thermally cured. The thermosetting resin layer 51 is an example of a second thermosetting resin layer. The ceramic layer 52 is an example of a second ceramic layer. The thermosetting resin layer 53 is an example of a fourth thermosetting resin layer. The insulating member 50 is an example of a second insulating member.

The solder layer 30 is provided on the surface 10B of the base 10. The solder layer 30 includes multiple (two in the illustrated example) regions 31. The regions 31 are separated and insulated from each other by the insulating member 50. For example, the material of the solder layer 30 is the same as the material of the solder layer 20. The regions 21 and the regions 31 are electrically connected to each other in one-to-one correspondence. For example, in the illustrated case, one of the regions 21 is electrically connected to one of the regions 31, and the other of the regions 21 is electrically connected to the other of the regions 31. The solder layer 30 is an example of a second solder layer. The regions 31 are an example of a second region.

The thermosetting resin layer 53 contacts part of the surface 70a of the substrate 70 in which part the electrodes 72 are absent. Furthermore, the regions 31 and the electrodes 72 are in contact with and electrically connected to each other in one-to-one correspondence. Accordingly, the regions 21 and the electrodes 72 are electrically connected to each other in one-to-one correspondence via the carbon nanotubes 11 and the regions 31. For example, in the illustrated case, one of the regions 21 is electrically connected to one of the electrodes 72, and the other of the regions 21 is electrically connected to the other of the electrodes 72.

Next, a method of manufacturing the thermal management part 91 according to the first embodiment is described. FIGS. 2A through 2F are sectional views illustrating a method of manufacturing a thermal management part according to the first embodiment.

Figure 2A:
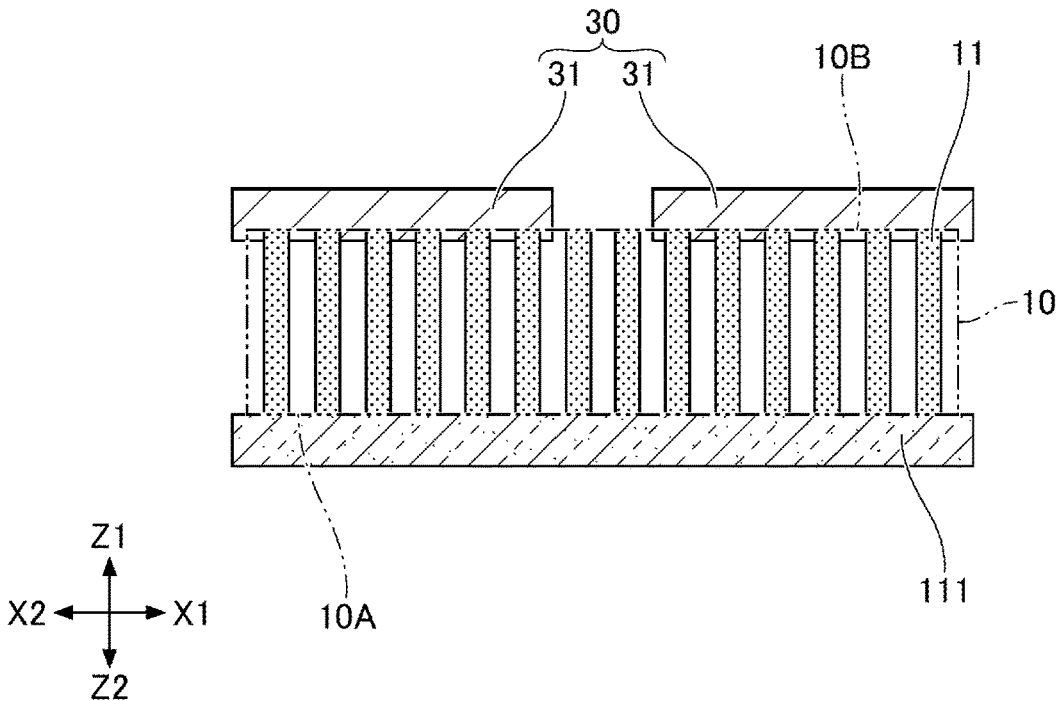
FIGS. 2A through 2F are sectional views illustrating a method of manufacturing a thermal management part according to the first embodiment.

First, as illustrated in FIG. 2A, the base 10 bristling with the carbon nanotubes 11 is prepared. The base 10 is on a base material 111. The base 10 is placed with the surface 10B facing upward and the surface 10A facing downward. The surface 10A contacts the base material 111. The base material 111 includes, for example, a catalytic metal layer and a silicon (Si) substrate used for growing the carbon nanotubes 11. The base material 111 may also be a silicone rubber sheet. Next, the solder layer 30 is placed on part of the surface 10B of the base 10 on which part to form the regions 31. The solder layer 30 is melted by application of heat so that part of the solder layer 30 penetrates into the base 10. For example, a heat gun or a soldering iron may be used to heat the solder layer 30. The solder layer 30 may also be heated through reflow soldering. Penetrating into the base 10 is, for example, entering gaps between the adjacent carbon nanotubes 11, and the same applies in the following description.

Figure 2B:
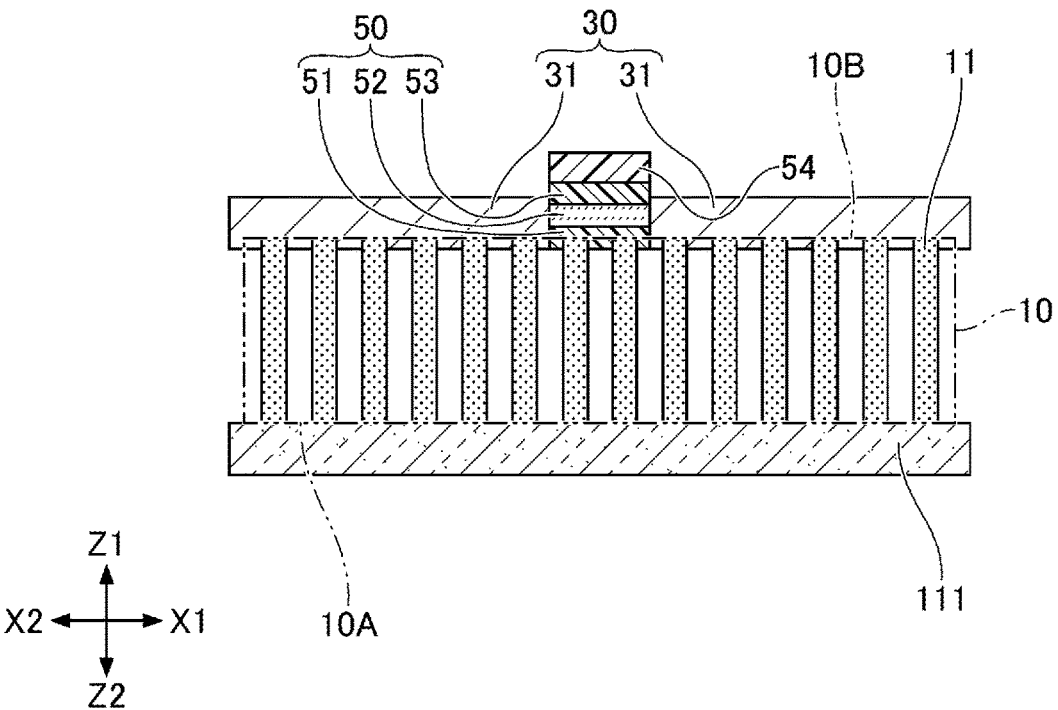

Thereafter, as illustrated in FIG. 2B, the insulating member 50 is placed between the regions 31, and heat treatment is performed. At this point, the thermosetting resin layer 53 is covered with a protective layer 54. The protective layer 54 protects the thermosetting resin layer 53 from contamination and damage. For example, the material of the protective layer 54 is the same as the material of the protective layer 44. The temperature of the heat treatment is such that the thermosetting resin layers 51 and 53 flow but are not thermally cured. The temperature of the heat treatment is, for example, approximately 80° C. to approximately 200° C. Thus, the temperature of the heat treatment is lower than the melting point of the solder layer 30, and accordingly, the solder layer 30 does not flow. This heat treatment causes the thermosetting resin layer 51 to penetrate into the base 10.

Figure 2C:
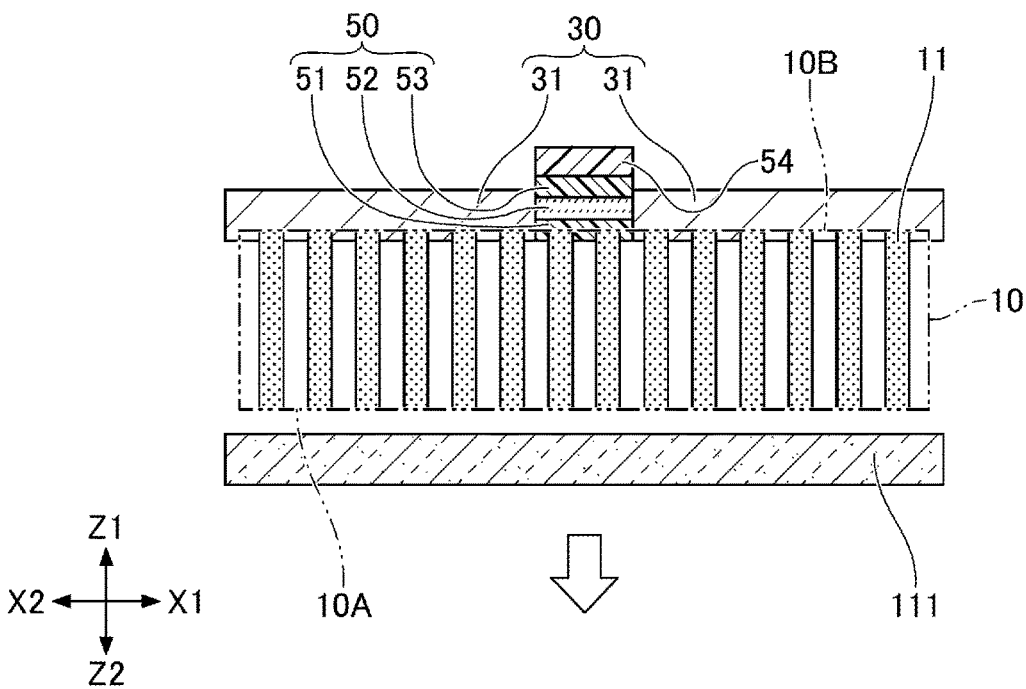

Next, as illustrated in FIG. 2C, the base material 111 is removed from the base 10.

Figure 2D:
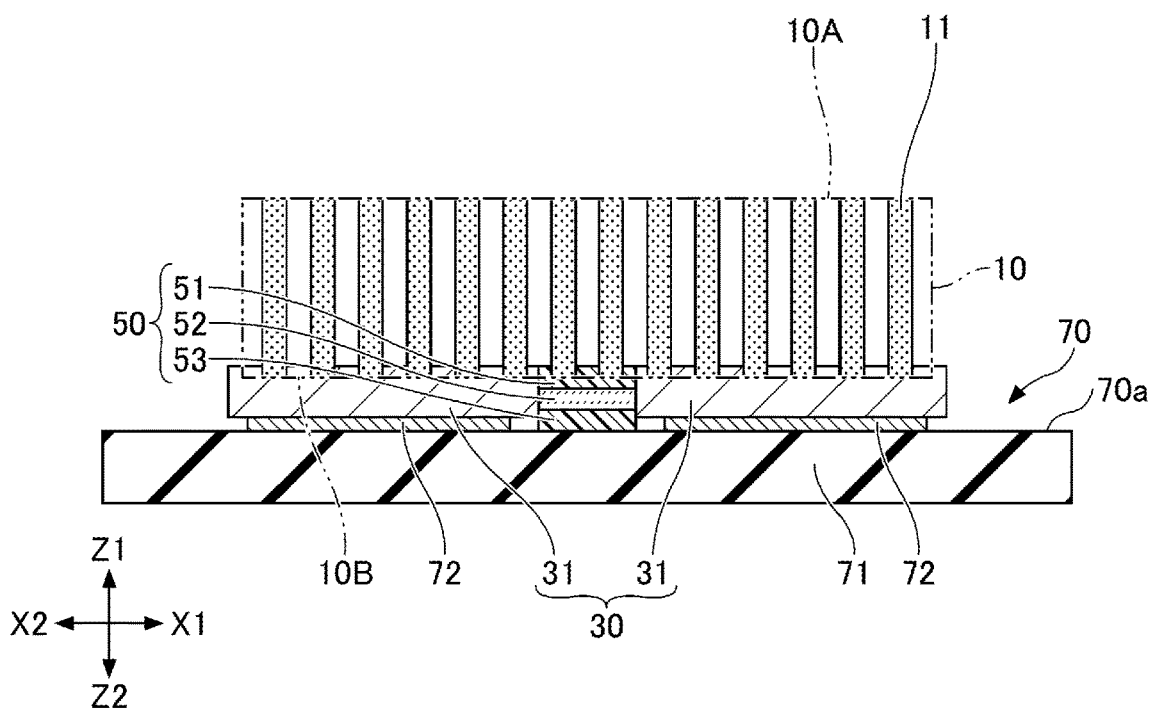

Next, as illustrated in FIG. 2D, the structure illustrated in FIG. 2C, from which the protective layer 54 has been removed, is placed on the substrate 70. At this point, the structure is inverted so that the surface 10A of the base 10 faces upward and the surface 10B of the base 10 faces downward, and the thermosetting resin layer 53 is brought into contact with the body 71. Furthermore, each region 31 is caused to face a corresponding one of the electrodes 72. Thereafter, heat treatment is performed at a temperature lower than the melting point of the solder layer 30 at which temperature the thermosetting resin layers 51 and 53 are thermally cured. As a result, the thermosetting resin layers 51 and 53 are thermally cured.

Figure 2E:
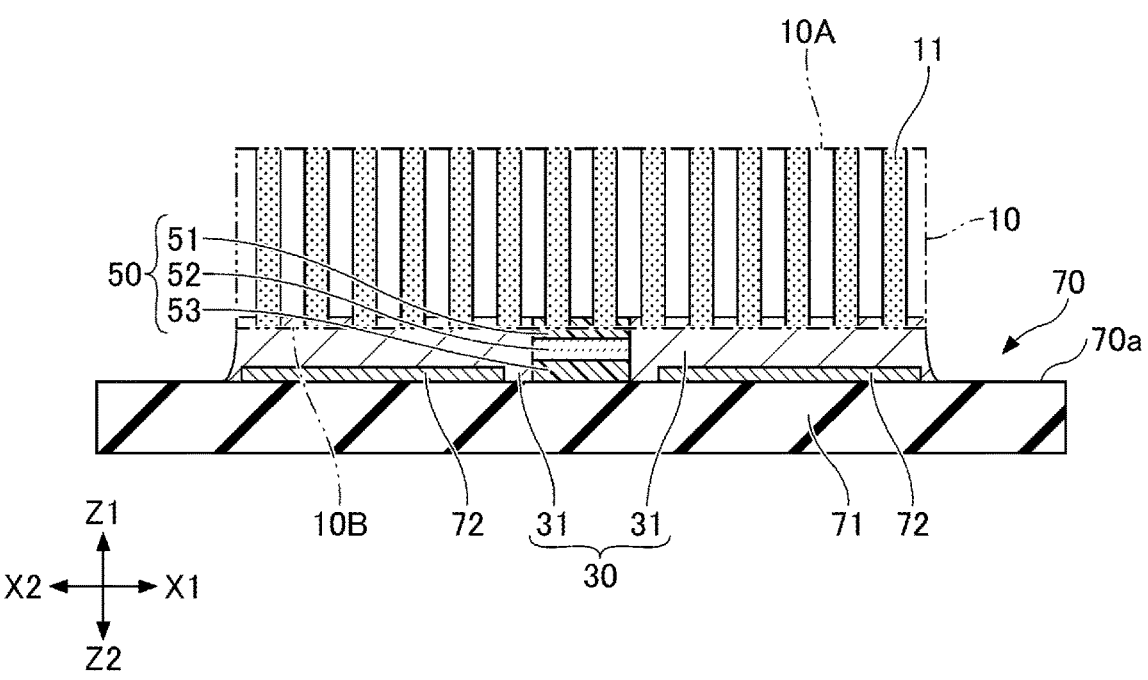

Next, as illustrated in FIG. 2E, reflow soldering is performed at a temperature higher than the melting point of the solder layer 30. The thermosetting resin layers 51 and 53, which are already thermally cured, do not flow during the reflow soldering. Accordingly, the electrical isolation between the regions 31 is maintained. Furthermore, the boundary between the thermosetting resin layer 51 and the ceramic layer 52 and the boundary between the thermosetting resin layer 53 and the ceramic layer 52 are covered with the solder layer 30. Therefore, the joining of the thermosetting resin layer 51 and the ceramic layer 52 and the joining of the thermosetting resin layer 53 and the ceramic layer 52 are strengthened.

Figure 2F:
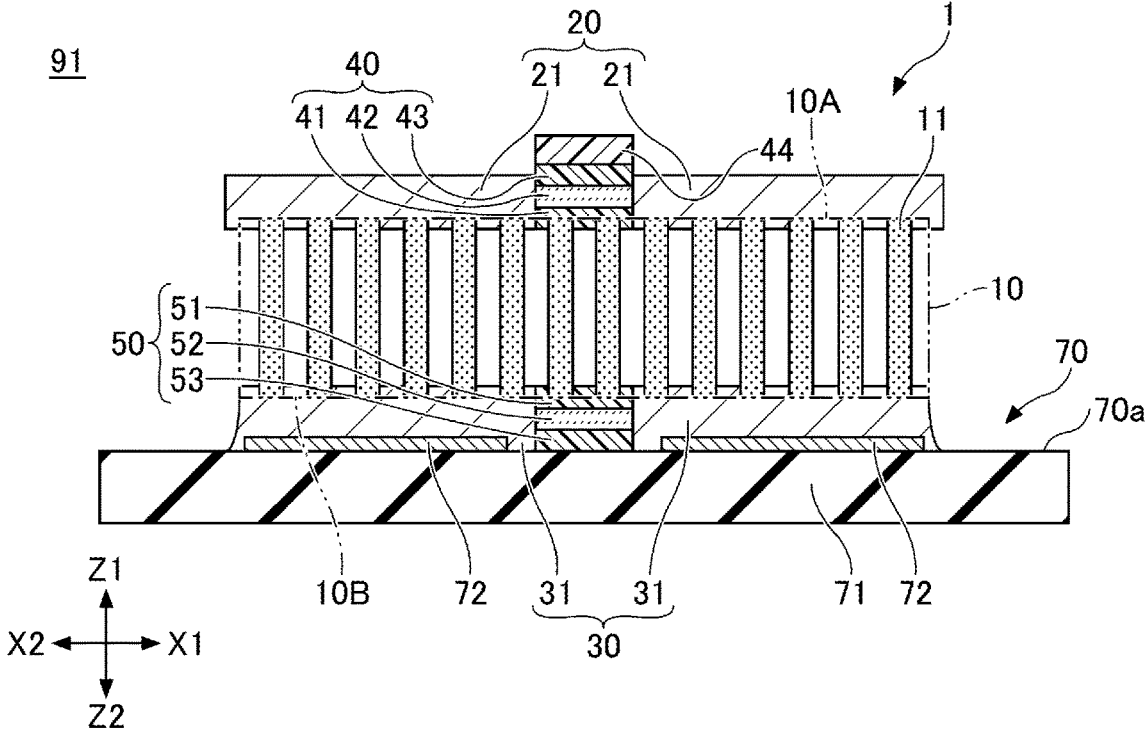

Next, as illustrated in FIG. 2F, the solder layer 20 is placed on part of the surface 10A of the base 10 on which part to form the regions 21. The solder layer 20 is melted by application of heat so that part of the solder layer 20 penetrates into the base 10. For example, a heat gun or a soldering iron may be used to heat the solder layer 20. The solder layer 20 may also be heated through reflow soldering. Thereafter, the insulating member 40 is placed between the regions 21, and heat treatment is performed. At this point, the thermosetting resin layer 43 is covered with the protective layer 44. The temperature of the heat treatment is such that the thermosetting resin layers 41 and 43 flow but are not thermally cured. The temperature of the heat treatment is, for example, approximately 80° C. to approximately 200° C. Thus, the temperature of the heat treatment is lower than the melting point of the solder layer 20, and accordingly, the solder layer 20 does not flow. This heat treatment causes the thermosetting resin layer 41 to penetrate into the base 10.

In this manner, the thermal management part 91 according to the first embodiment can be manufactured. The thermal management part 91 includes the heat conductor 1 and the substrate 70.

The thermal management part 91 is used, for example, with a semiconductor device such as an integrated circuit (IC) chip being joined onto the solder layer 20. At this point, electrodes of the semiconductor device are electrically connected individually to the regions 21 of the solder layer 20. Heat radiated from the semiconductor device is transmitted to the substrate 70 via the heat conductor 1 and is released outside from the substrate 70. Furthermore, the electrodes 72 of the substrate 70 are electrically connected individually to the electrodes of the semiconductor device. Accordingly, each electrode of the semiconductor device can be independently supplied with voltage, and signals can be transmitted and received independently between each electrode of the semiconductor device and an external terminal of the substrate 70.

Furthermore, even when the insulating member 40 is constituted only of a thermosetting resin layer, it is possible to ensure electrical isolation between the regions 21. The inclusion of the ceramic layer 42 in the insulating member 40, however, can provide better thermal conductivity between the base 10 and an electronic component such as a semiconductor device. Likewise, even when the insulating member 50 is constituted only of a thermosetting resin layer, it is possible to ensure electrical isolation between the regions 31. The inclusion of the ceramic layer 52 in the insulating member 50, however, can provide better thermal conductivity between the base 10 and the substrate 70.

An electronic component such as a semiconductor device may be used in place of the substrate 70. In this case, for example, a substrate such as a DBC substrate is joined to the solder layer 20.

[b] Second Embodiment

A second embodiment is described. The second embodiment relates to a heat conductor.

Figure 3A:
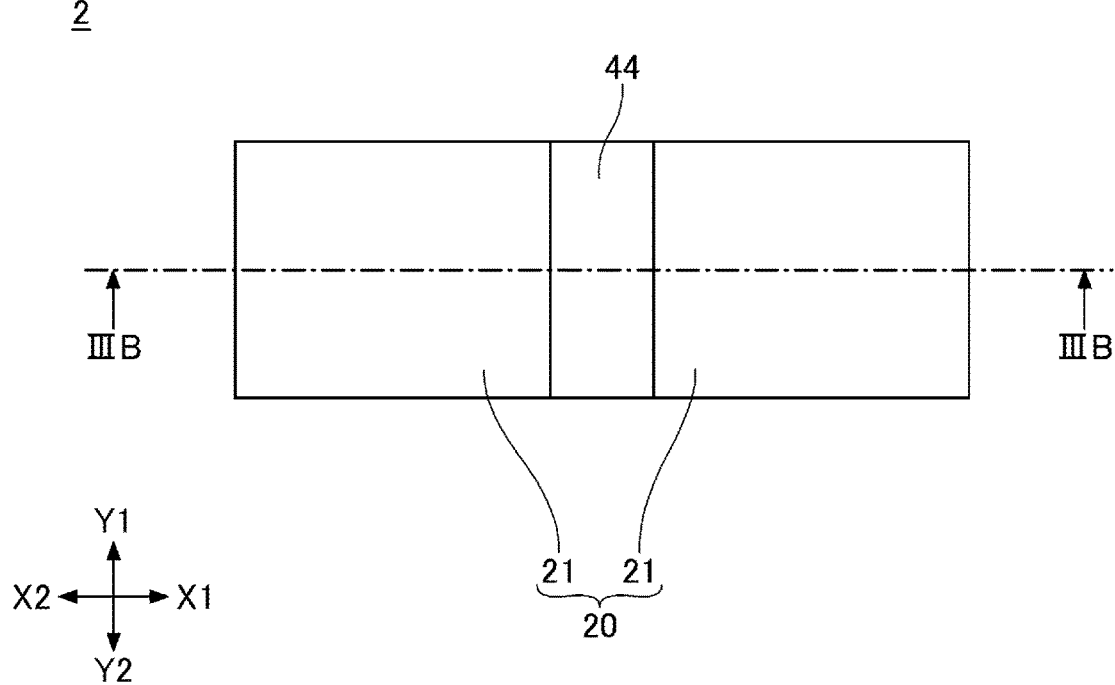
FIGS. 3A and 3B are diagrams illustrating a heat conductor according to a second embodiment.
Figure 3B:
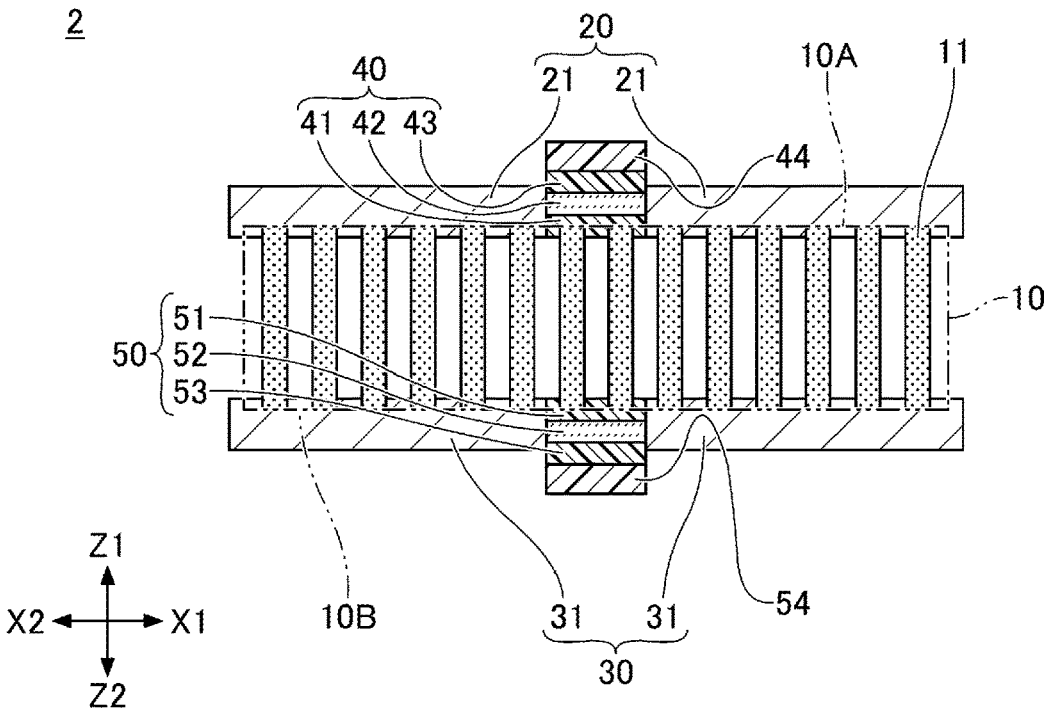

First, a structure of a heat conductor according to the second embodiment is described. FIGS. 3A and 3B are a plan view and a sectional view, respectively, of a heat conductor according to the second embodiment. FIG. 3B illustrates a section taken along the line IIIB-IIIB of FIG. 3A.

As illustrated in FIGS. 3A and 3B, a heat conductor 2 according to the second embodiment includes the base 10, the solder layer 20, the solder layer 30, the insulating member 40, the insulating member 50, the protective layer 44, and the protective layer 54.

According to the second embodiment, not only the thermosetting resin layers 41 and 43 but also the thermosetting resin layers 51 and 53 are uncured. The protective layer 54 is provided on (under) the thermosetting resin layer 53. The protective layer 54 covers the thermosetting resin layer 53. The protective layer 54 protects the thermosetting resin layer 53 from contamination and damage. For example, the material of the protective layer 54 is the same as the material of the protective layer 44. The protective layer 54 is an example of a second protective layer.

Otherwise, the configuration of the heat conductor 2 is the same as the configuration of the heat conductor 1 according to the first embodiment.

Next, a method of manufacturing the heat conductor 2 according to the second embodiment is described. FIGS. 4A through 4E are sectional views illustrating a method of manufacturing a heat conductor according to the second embodiment.

Figure 4A:
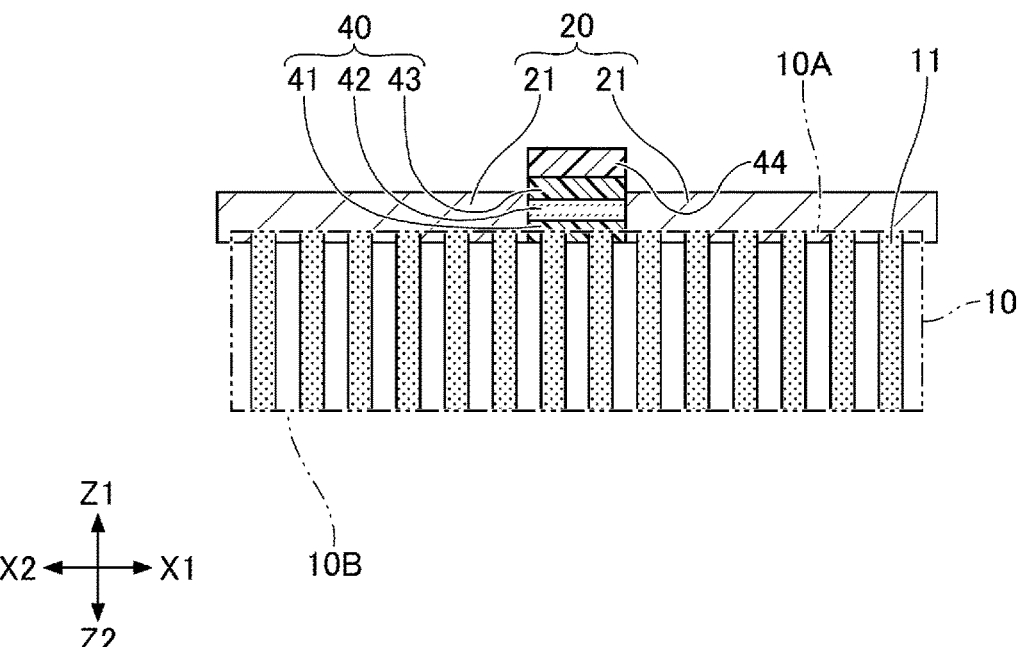
FIGS. 4A through 4E are sectional views illustrating a method of manufacturing a heat conductor according to the second embodiment.

First, the same as in the first embodiment, the process up to the removal of the base material 111 from the base 10 (see FIG. 2C) is executed. As illustrated in FIG. 4A, however, instead of providing the solder layer 30 and the insulating member 50 on the surface 10B of the base 10, the solder layer 20 and the insulating member 40 are provided on the surface 10A of the base 10. Furthermore, the thermosetting resin layer 43 is covered with the protective layer 44.

Figure 4B:
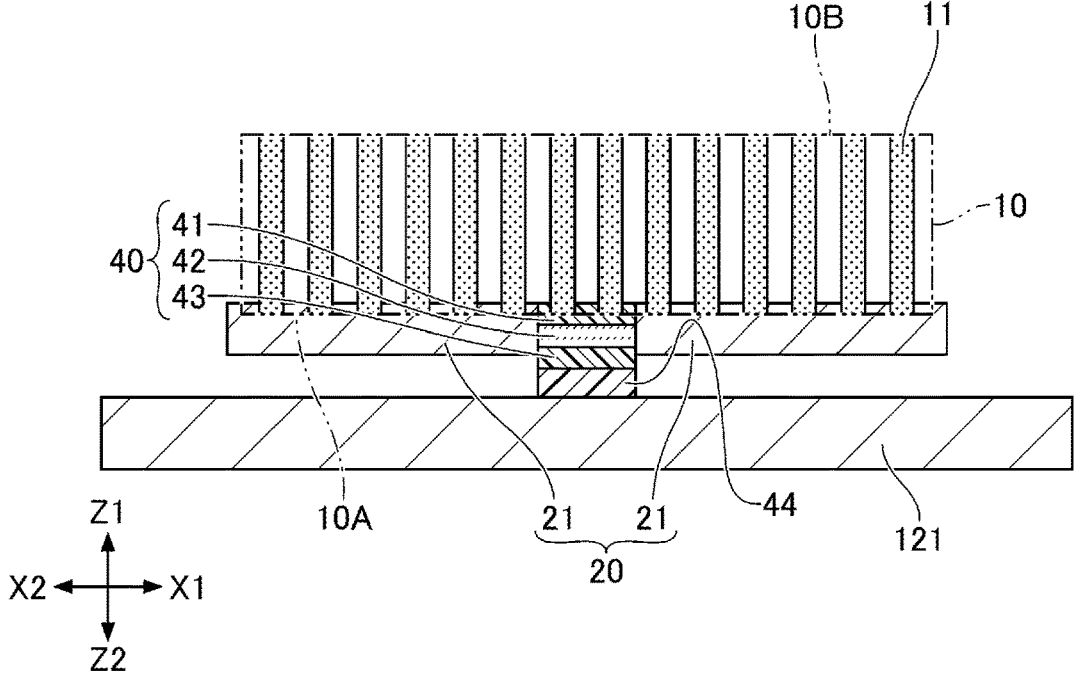

Next, as illustrated in FIG. 4B, the structure illustrated in FIG. 4A is placed on a cooling plate 121 without removing the protective layer 44. At this point, the structure is inverted so that the surface 10B of the base 10 faces upward and the surface 10A of the base 10 faces downward, and the protective layer 44 is brought into contact with the cooling plate 121.

Figure 4C:
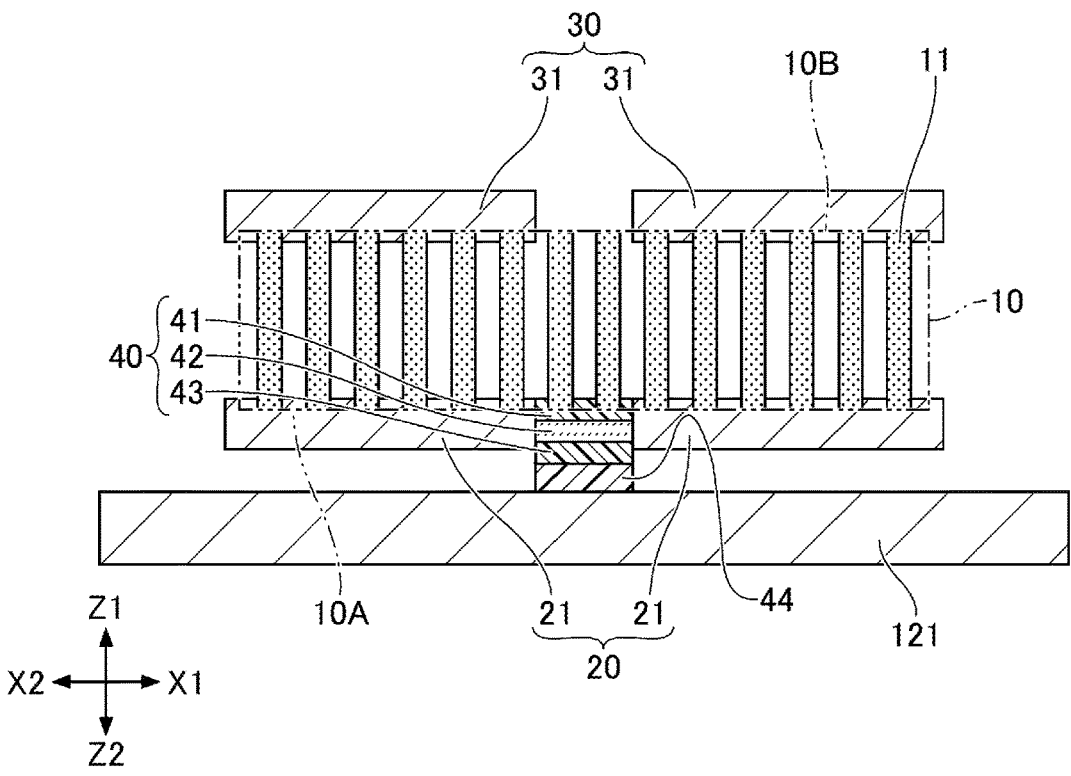

Thereafter, as illustrated in FIG. 4C, the solder layer 30 is placed on part of the surface 10B of the base 10 on which part to form the regions 31, and the solder layer 30 is heated while cooling the solder layer 20 with the cooling plate 121. As a result, the solder layer 30 melts without the melting of the solder layer 20, and part of the solder layer 30 penetrates into the base 10. For example, a heat gun or a soldering iron may be used to heat the solder layer 30.

Figure 4D:
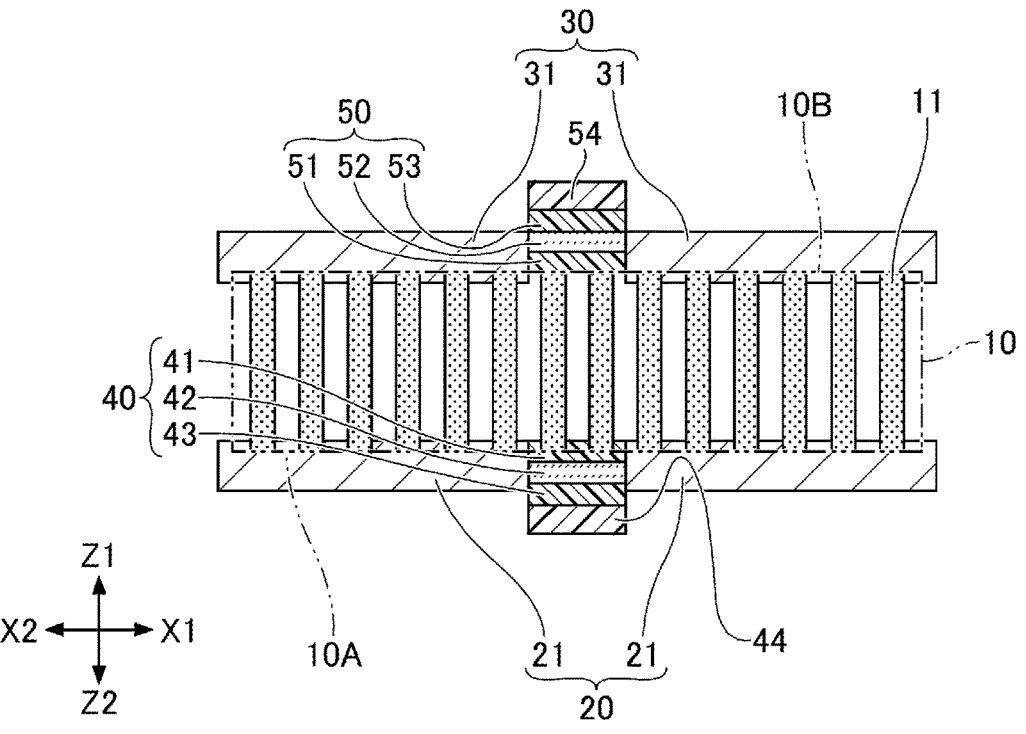

Next, as illustrated in FIG. 4D, the insulating member 50 is placed between the regions 31. At this point, the thermosetting resin layer 53 is covered with the protective layer 54.

Figure 4E:
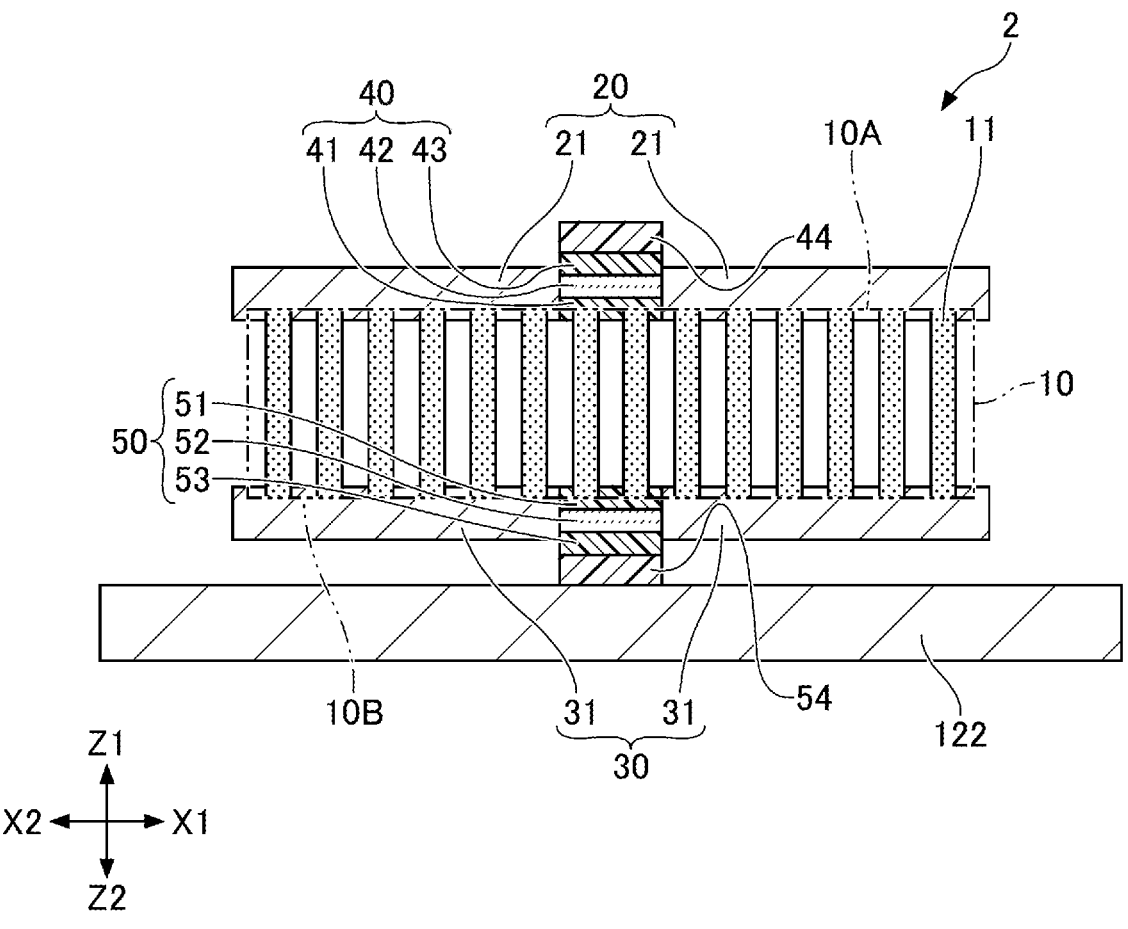

Next, as illustrated in FIG. 4E, the structure illustrated in FIG. 4D is inverted so that the surface 10A of the base 10 faces upward and the surface 10B of the base 10 faces downward, and is placed on a heat source 122 with the protective layer 54 contacting the heat source 122. Then, the thermosetting resin layers 51 and 53 are heated with the heat source 122. The temperature of the heat source 122 is such that the thermosetting resin layers 51 and 53 flow but are not thermally cured. The temperature of the heat treatment is, for example, approximately 80° C. to approximately 200° C. Thus, the temperature of the heat source 122 is lower than the melting point of the solder layers 20 and 30, and accordingly, the solder layers 20 and 30 do not flow. As a result of heating with the heat source 122, the thermosetting resin layer 51 penetrates into the base 10.

In this manner, the heat conductor 2 according to the second embodiment can be manufactured.

When in use, the heat conductor 2 according to the second embodiment is, for example, sandwiched between a substrate and a semiconductor device as illustrated below.

According to the method of manufacturing the heat conductor 2, the structure illustrated in FIG. 4D does not have to be inverted to be placed on the heat source 122 if the thermosetting resin layer 51 is sufficiently heated with the heat source 122.

[c] Third Embodiment

A third embodiment is described. The third embodiment relates to a thermal management part including the heat conductor 2 according to the second embodiment.

Figure 5:
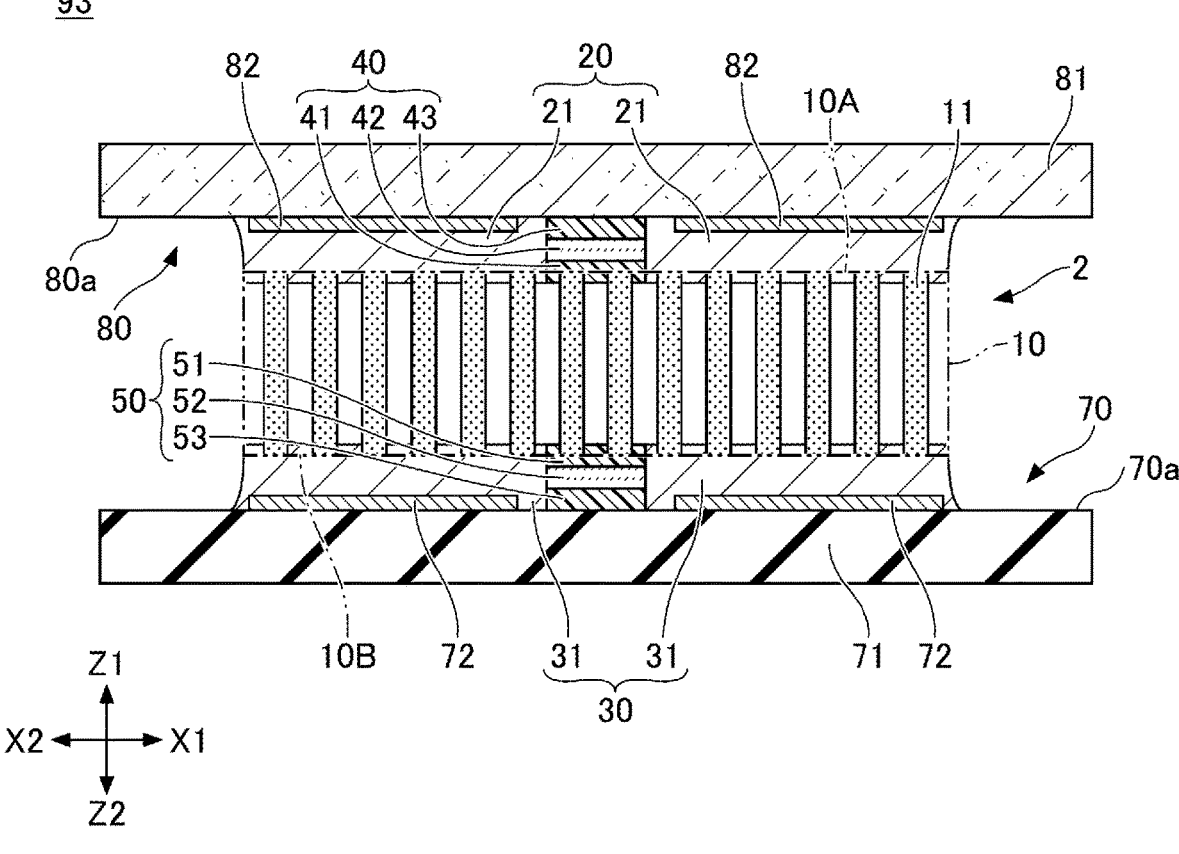
FIG. 5 is a sectional view of a thermal management part according to a third embodiment.

First, a structure of a thermal management part according to the third embodiment is described. FIG. 5 is a sectional view of a thermal management part according to the third embodiment.

As illustrated in FIG. 5, a thermal management part 93 according to a third embodiment includes the substrate 70, the heat conductor 2, and a semiconductor device 80.

The same as the heat conductor 1 according to the first embodiment, the heat conductor 2 is provided on the substrate 70. The regions 31 of the solder layer 30 are in contact with the electrodes 72 of the substrate 70 through melting and solidification in reflow soldering.

The semiconductor device 80 includes a body 81 and multiple (two in the illustrated case) electrodes 82. The electrodes 82 are provided on a surface of the body 81 (a surface 80a of the semiconductor device 80). The semiconductor device 80 is, for example, an IC chip. The semiconductor device 80 operates to radiate heat. The regions 21 of the solder layer 20 are in contact with the electrodes 82 of the semiconductor device 80 through melting and solidification in reflow soldering. Accordingly, the electrodes 82 and the electrodes 72 are electrically connected to each other in one-to-one correspondence via the carbon nanotubes 11 and the regions 21 and 31. For example, in the illustrated case, one of the electrodes 82 is electrically connected to one of the electrodes 72, and the other of the electrodes 82 is electrically connected to the other of the electrodes 72.

Figure 6A:
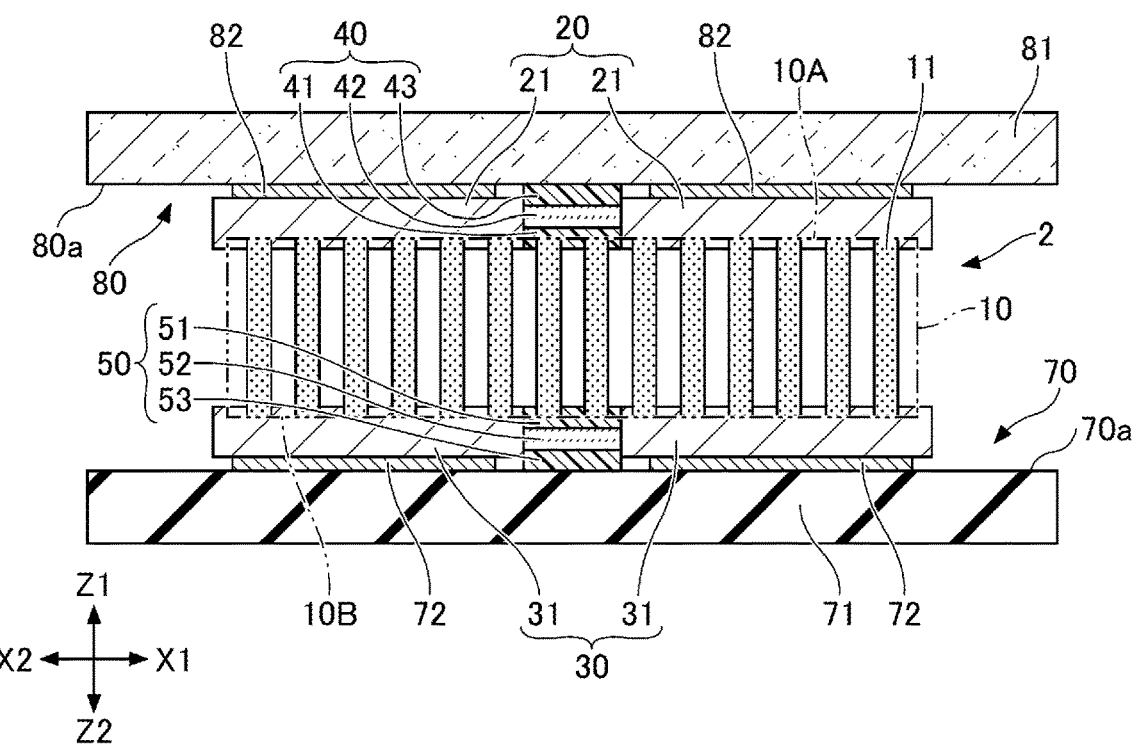
FIGS. 6A and 6B are sectional views illustrating a method of manufacturing a thermal management part according to the third embodiment.
Figure 6B:
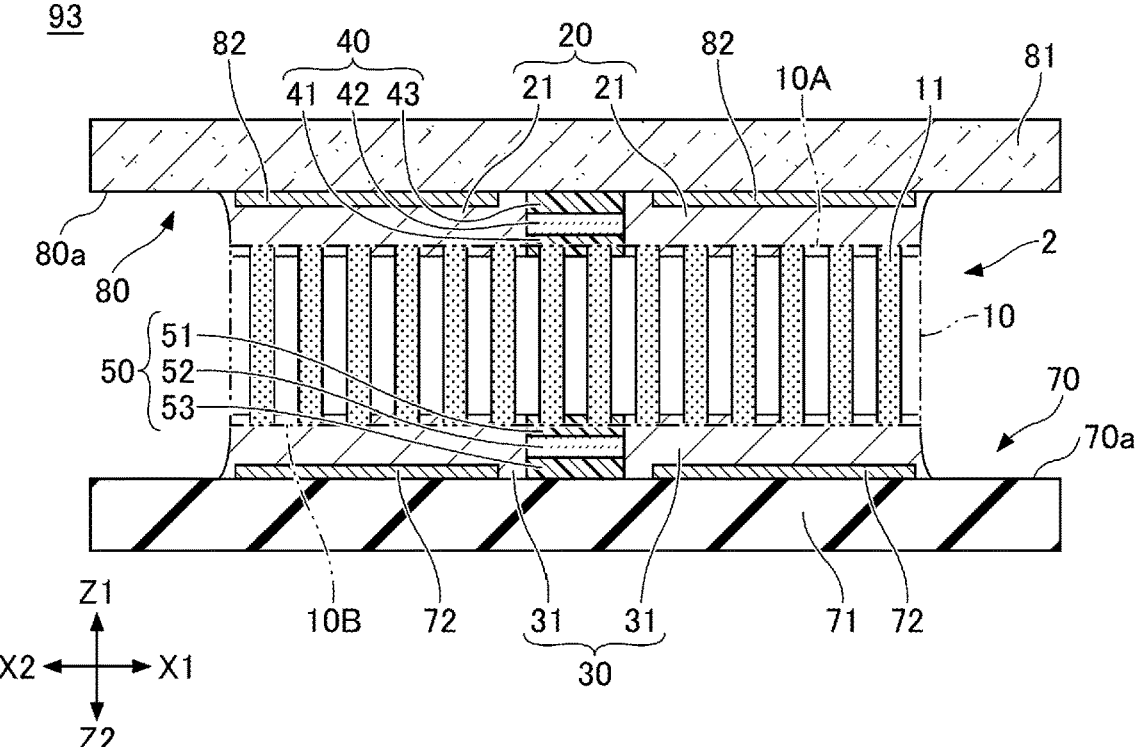

Next, a method of manufacturing the thermal management part 93 according to the third embodiment is described. FIGS. 6A and 6B are sectional views illustrating a method of manufacturing a thermal management part according to the third embodiment.

First, as illustrated in FIG. 6A, the heat conductor 2 according to the second embodiment, from which the protective layers 44 and 54 are removed, is placed on the substrate 70, and the semiconductor device 80 is placed on the heat conductor 2. At this point, the surface 10B of the base 10 is caused to face toward the surface 70a of the substrate 70, on which the electrodes 72 are provided, and the surface 80a of the semiconductor device 80, on which the electrodes 82 are provided, is caused to face toward the surface 10A of the base 10.

Next, as illustrated in FIG. 6B, the solder layers 20 and 30 are subjected to reflow soldering. The thermosetting temperature of the thermosetting resin layers 41, 43, 51 and 53 is lower than the melting point of the solder layers 20 and 30. Therefore, the thermosetting resin layers 41, 43, 51 and 53 are thermally cured before the solder layers 20 and 30 melt. Accordingly, electrical isolation is maintained between the regions 21, and electrical isolation is maintained between the regions 31. Furthermore, the boundary between the thermosetting resin layer 41 and the ceramic layer 42 and the boundary between the thermosetting resin layer 43 and the ceramic layer 42 are covered with the solder layer 20. Therefore, the joining of the thermosetting resin layer 41 and the ceramic layer 42 and the joining of the thermosetting resin layer 43 and the ceramic layer 42 are strengthened. Likewise, the boundary between the thermosetting resin layer 51 and the ceramic layer 52 and the boundary between the thermosetting resin layer 53 and the ceramic layer 52 are covered with the solder layer 30. Therefore, the joining of the thermosetting resin layer 51 and the ceramic layer 52 and the joining of the thermosetting resin layer 53 and the ceramic layer 52 are strengthened.

In this manner, the thermal management part 93 according to the third embodiment can be manufactured.

According to the thermal management part 93, heat radiated from the semiconductor device 80 is transmitted to the substrate 70 via the heat conductor 2 and is released outside from the substrate 70. Furthermore, the electrodes 72 of the substrate 70 are electrically connected individually to the electrodes 82 of the semiconductor device 80. Accordingly, each electrode 82 of the semiconductor device 80 can be independently supplied with voltage, and signals can be transmitted and received independently between each electrode 82 of the semiconductor device 80 and an external terminal of the substrate 70.

According to each embodiment, the insulating members 40 and 50 may be omitted. In this case as well, voltage can be independently applied or a signal can be independently transmitted and received via the heat conductor 1 or 2.

Furthermore, the layout of the insulating member 40, the insulating member 50, the regions 21, and the regions 31 is not limited to that of each embodiment. FIGS. 7A through 7F are diagrams illustrating example layouts of insulating members and regions.

Figure 7B:
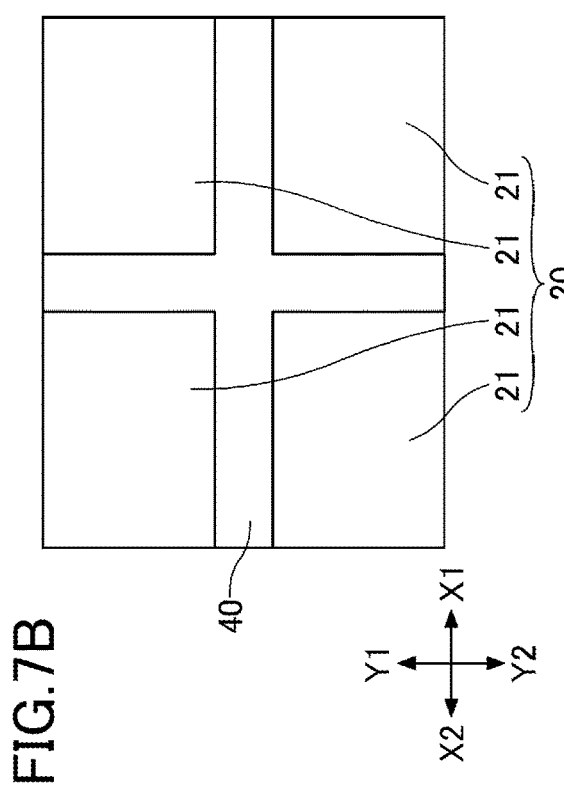
FIGS. 7A through 7F are diagrams illustrating layouts of insulating members and regions.
Figure 7D:
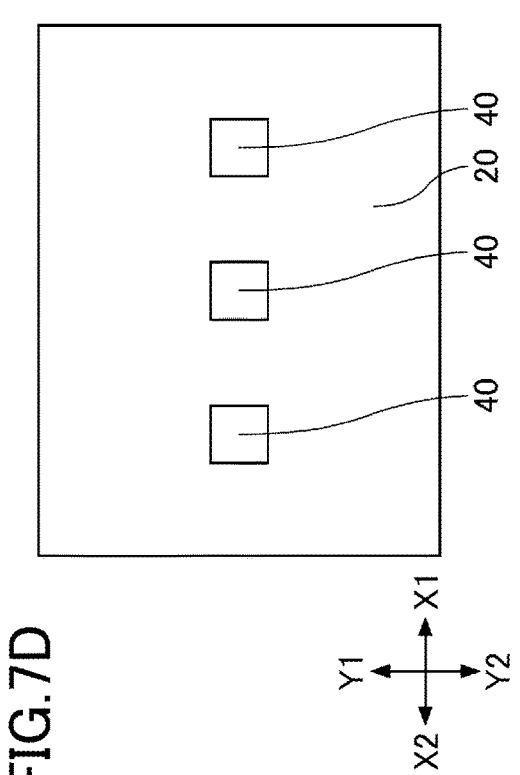
Figure 7A:
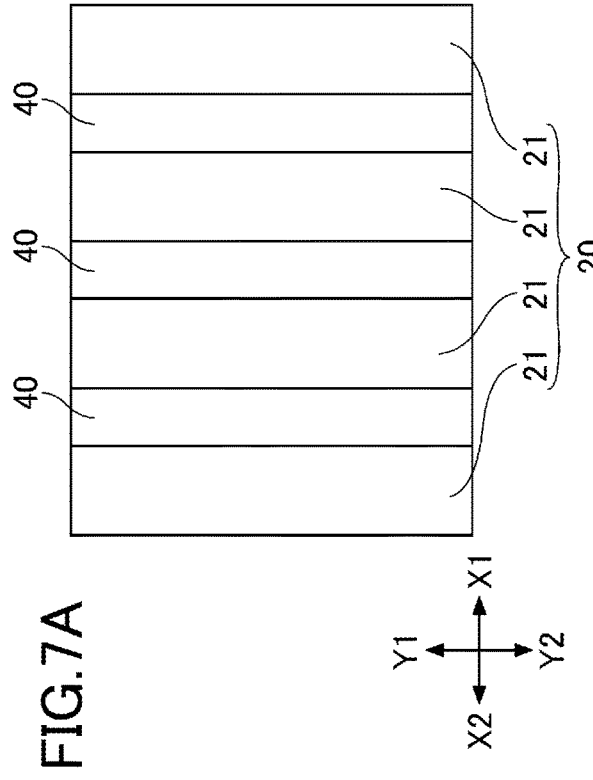

According to the example illustrated in FIG. 7A, the three insulating members 40 elongated in the Y1-Y2 direction are equally spaced in the X1-X2 direction on the surface 10A. The solder layer 20 includes the four regions 21, and the four regions 21 are separated and insulated from each other by the insulating members 40. Furthermore, although not depicted, the three insulating members 50 elongated in the Y1-Y2 direction are placed on the surface 10B such that the insulating members 40 and 50 are positioned one over the other in a plan view, and the solder layer 30 includes the four regions 31. The regions 21 and 31 are one over the other in a plan view.

According to the example illustrated in FIG. 7B, the insulating member 40 having a cross planar shape is placed on the surface 10A. The insulating member 40 includes a part elongated in the Y1-Y2 direction and a part elongated in the X1-X2 direction. The solder layer 20 includes the four regions 21, and the four regions 21 are separated and insulated from each other by the insulating members 40. Furthermore, although not depicted, the insulating member 50 having a cross planar shape is placed on the surface 10B such that the insulating members 40 and 50 are positioned one over the other in a plan view, and the solder layer 30 includes the four regions 31. The regions 21 and 31 are one over the other in a plan view.

Figure 7C:
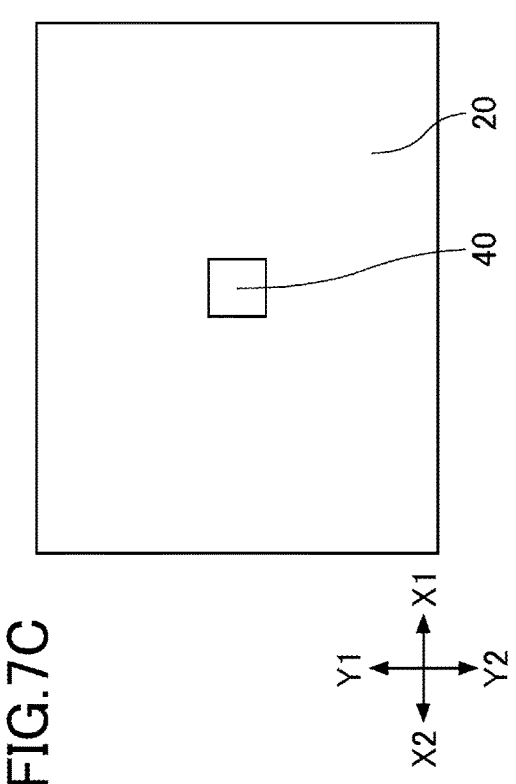

According to the example illustrated in FIG. 7C, the insulating member 40 having a square planar shape is placed at the center of the surface 10A in both of the Y1-Y2 direction and the X1-X2 direction. The solder layer 20 surrounds the insulating member 40 in a plan view. Furthermore, although not depicted, the insulating member 50 having a square planar shape is placed at the center of the surface 10B such that the insulating members 40 and 50 are positioned one over the other in a plan view, and the solder layer 30 surrounds the insulating member 50 in a plan view.

According to the example illustrated in FIG. 7D, the three insulating members 40 each having a square planar shape are equally spaced in the X1-X2 direction at the center of the surface 10A in the Y1-Y2 direction. The solder layer 20 surrounds the three insulating members 40 in a plan view. Furthermore, although not depicted, the three insulating members 50 each having a square planar shape are placed on the surface 10B such that the insulating members 40 and 50 are positioned one over the other in a plan view. The solder layer 30 surrounds the insulating members 50 in a plan view.

Figure 7F:
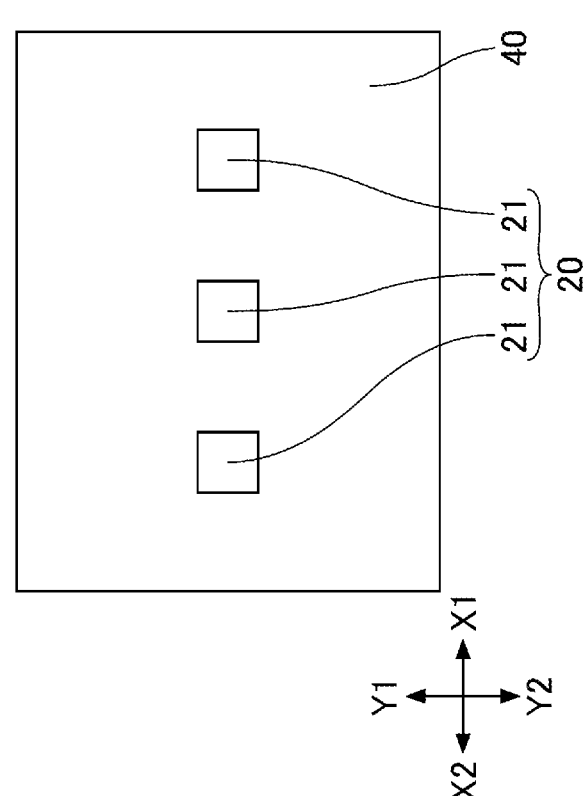
Figure 7E:
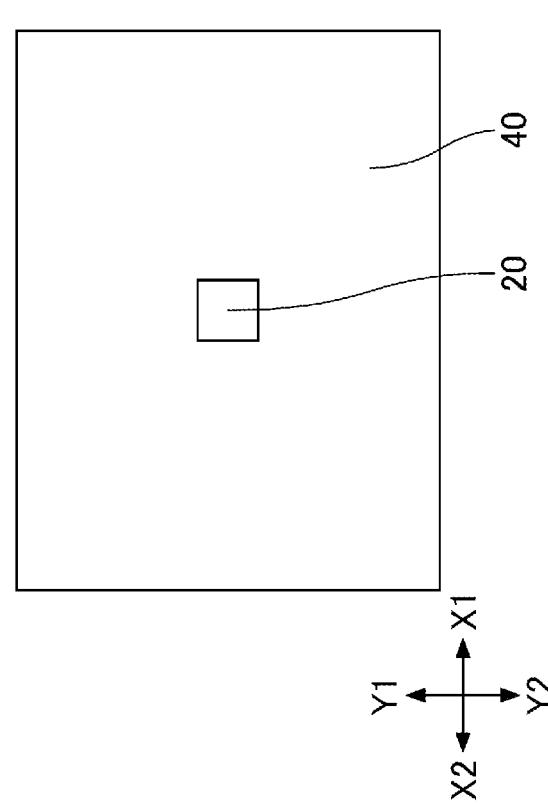

According to the example illustrated in FIG. 7E, the solder layer 20 having a square planar shape is placed at the center of the surface 10A in both of the Y1-Y2 direction and the X1-X2 direction. The insulating member 40 surrounds the solder layer 20 in a plan view. Furthermore, although not depicted, the solder layer 30 having a square planar shape is placed on the surface 10B such that the solder layers 20 and 30 are positioned one over the other in a plan view, and the insulating member 50 surrounds the solder layer 30.

According to the example illustrated in FIG. 7F, the solder layer 20 includes the three regions 21 each having a square planar shape, and the regions 21 are equally spaced in the X1-X2 direction at the center of the surface 10A in the Y1-Y2 direction. The insulating member 40 surrounds the three regions 21 in a plan view. Furthermore, although not depicted, the solder layer 30 includes the three regions 31 each having a square planar shape, and the regions 31 are placed on the surface 10B such that the regions 21 and 31 are positioned one over the other in a plan view. The insulating member 50 surrounds the three regions 31 in a plan view.

Furthermore, according to the heat conductors 1 and 2, air gaps between the adjacent carbon nanotubes 11 may be filled with resin between the solder layers 20 and 30.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A heat conductor comprising:
   a base including a forest of carbon nanotubes;
   a first solder layer on a first surface of the base;
   a second solder layer on a second surface of the base opposite from the first surface, the second solder layer being electrically connected to the first solder layer via the carbon nanotubes;
   a first insulating member on the first surface; and
   a second insulating member on the second surface,
   wherein the first insulating member includes a first thermosetting resin layer on the first surface,
   the second insulating member includes a second thermosetting resin layer on the second surface,
   the first insulating member further includes
      a first ceramic layer contacting the first thermosetting resin layer; and
      a third thermosetting resin layer contacting the first ceramic layer, the second insulating member further includes
      a second ceramic layer contacting the second thermosetting resin layer; and
      a fourth thermosetting resin layer contacting the second ceramic layer,
   the first thermosetting resin layer is between the base and the first ceramic layer,
   the first ceramic layer is between the first thermosetting resin layer and the third thermosetting resin layer,
   the second thermosetting resin layer is between the base and the second ceramic layer, and
   the second ceramic layer is between the second thermosetting resin layer and the fourth thermosetting resin layer.

2. The heat conductor as claimed in claim 1, wherein each of the first insulating member and the second insulating member has a part thereof penetrating into the base.

3. The heat conductor as claimed in claim 1, wherein the first solder layer and the second solder layer are positioned one over another and the first insulating member and the second insulating member are positioned one over another in a plan view.

4. The heat conductor as claimed in claim 1, wherein
   the first solder layer includes a plurality of first regions separated and insulated from each other by the first insulating member,
   the second solder layer includes a plurality of second regions separated and insulated from each other by the second insulating member,
   each of the first regions is electrically connected to a corresponding one of the second regions.

5. The heat conductor as claimed in claim 1, wherein a boundary between the second thermosetting resin layer and the second ceramic layer and a boundary between the fourth thermosetting resin layer and the second ceramic layer are covered with the second solder layer.

6. The heat conductor as claimed in claim 5, wherein a boundary between the first thermosetting resin layer and the first ceramic layer and a boundary between the third thermosetting resin layer and the first ceramic layer are covered with the first solder layer.

7. The heat conductor as claimed in claim 1, wherein the first thermosetting resin layer and the third thermosetting resin layer are uncured.

8. The heat conductor as claimed in claim 7, further comprising:

a protective layer covering the third thermosetting resin layer.

9. The heat conductor as claimed in claim 1, wherein the first thermosetting resin layer, the second thermosetting resin layer, the third thermosetting resin layer, and the fourth thermosetting resin layer are uncured.

10. The heat conductor as claimed in claim 9, further comprising:

a first protective layer covering the third thermosetting resin layer, and a second protective layer covering the fourth thermosetting resin layer.

11. The heat conductor as claimed in claim 1, wherein the second solder layer has a melting point higher than a thermosetting temperature of the second thermosetting resin layer and the fourth thermosetting resin layer.

12. The heat conductor as claimed in claim 11, wherein the first solder layer has a melting point higher than a thermosetting temperature of the first thermosetting resin layer and the third thermosetting resin layer.

13. A thermal management part comprising:

the heat conductor as set forth in claim 1; and a substrate joined to the first solder layer or the second solder layer.

14. A thermal management part comprising:

the heat conductor as set forth in claim 1; and an electronic component joined to the first solder layer or the second solder layer.

15. A thermal management part comprising:

the heat conductor as set forth in claim 1;

an electronic component joined to the first solder layer; and a substrate joined to the second solder layer.

\* \* \* \* \*